(12) United States Patent
Murai et al.

(10) Patent No.: US 6,617,660 B2
(45) Date of Patent: *Sep. 9, 2003

(54) FIELD EFFECT TRANSISTOR SEMICONDUCTOR AND METHOD FOR MANUFACTURING THE SAME

(75) Inventors: Shigeyuki Murai, Osaka (JP); Emi Fujii, Osaka (JP); Shigeharu Matsushita, Osaka (JP); Hisaaki Tominaga, Osaka (JP)

(73) Assignee: Sanyo Electric Co., Ltd., Osaka (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/391,507

(22) Filed: Sep. 8, 1999

(65) Prior Publication Data
US 2003/0113985 A1 Jun. 19, 2003

(30) Foreign Application Priority Data
Sep. 9, 1998 (JP) ............................................ 10-254777

(51) Int. Cl.$^7$ ......................... H01L 29/095; H01L 29/47
(52) U.S. Cl. ........................ 257/472; 257/473; 257/570
(58) Field of Search .................................. 257/472, 473, 257/570

(56) References Cited

U.S. PATENT DOCUMENTS 4,735,913 A * 4/1988 Hayes
5,047,811 A * 9/1991 Miyano

FOREIGN PATENT DOCUMENTS

| JP | 55-138875 | 10/1980 |
|----|-----------|---------|
| JP | 57-120380 | 7/1982 |
| JP | 4-352431 | 12/1992 |
| JP | 11-265898 | 9/1999 |

OTHER PUBLICATIONS

"GaAs LSI–Directed MESFET's with Self–Aligned Implantation for n$^+$–Layer Technology (SAINT)," IEEE Transactions on Electron Devices, vol. ED–29, No. 11, Nov. 1982, pp. 1772–1777.

* cited by examiner

Primary Examiner—Stephen D. Meier
(74) Attorney, Agent, or Firm—Arent Fox Kintner Plotkin & Kahn

(57) ABSTRACT

This invention has an objective to provide a field effect transistor semiconductor which has great adhesiveness between a gate metal and an insulating film defining a gate electrode end and to improve production yield thereof.

The field effect transistor semiconductor of this invention comprises a source/drain electrode 6 positioned in a predetermined position in a GaAs substrate 1, a channel region provided in the GaAs substrate 1 and between the source/drain electrodes 6, a gate electrode 11 which is in schottky contact with a part of a channel region and is positioned between the source/drain electrodes 6, and an insulating film 7 which electrically insulates a surface of the GaAs substrate and the gate electrode 11 at both side surfaces of the gate electrode 11. The gate electrode 11 covers a part of the insulating film 7 and the surface of the GaAs substrate serving as the channel region, and a bottom metallic layer 8 contained in the gate electrode 11 is covered with a second metallic layer 9 which is highly adhesive to the insulating film 7.

9 Claims, 8 Drawing Sheets

FIELD EFFECT TRANSISTOR SEMICONDUCTOR AND METHOD FOR MANUFACTURING THE SAME

BACKGROUND OF THE INVENTION

1. Field of the invention

The present invention relates to a field effect transistor semiconductor, more particularly relates to a structure of a gate electrode of the field effect transistor using a GaAs substrate and a method for manufacturing the same.

2. Description of the prior art

Various self-alignment processes for a metal semiconductor field effect transistor (herein after referred as a MESFET) using a GaAs substrate etc. have been developed to improve an accuracy of a gate length and obtain such as lower source resistance by avoiding possible effects from a surface depletion layer. Explanation will be made, with reference to FIGS. 5A to 5F, on a self-alignment process using a dummy gate when a GaAs epitaxial semiconductor substrate is used.

A silicon nitride (SiN) protection film 102 of 50 nm in thick is formed on a GaAs epitaxial semiconductor substrate 101 having a channel layer by an ECR (electron cyclotron resonance) plasma CVD (chemical vapor deposition) method. A dummy gate 103 is formed on the SiN protection film 102 by photoresist and an n$^+$layer 104 is formed by self-align ion-implantation (see FIG. 5A).

Then, the width of the dummy gate 103 is reduced by oxygen plasma to shorten the length of the dummy gate (see FIG. 5B). As found from the subsequent processes, this process defines a distance between a gate electrode end and an n$^+$layer 104. Generally, in a case of a GaAs MESFET, the distance of about 200–500 nm is often applied.

Then, a silicon oxide (SiO$_2$) layer 105 as an insulating film is deposited by an ECR plasma CVD method and the SiO$_2$ layer adhering only to a side wall of the dummy gate 103 is selectively etched (see FIG. 5C).

Further, a gate pattern is formed by a lift-off method, and is annealed by a rapid thermal process (see FIG. 5D).

A source/drain electrode 106 containing a laminated metallic layer of AuGe (gold, germanium)/Ni (nickel)/Au (gold) and a gate electrode 107 containing a laminated metallic layer of Pt (platinum)/Ti (titan)/Pd (paradium)/Au (gold) are formed by photoresist patterning technique (see FIG. 5E).

After forming a protecting film 108 for purposes of moisture protection etc. and a contact hole, an electrode 109 to be in contact with an external bias is formed by patterning technique (see FIG. 5F).

In the above GaAsMESFET, a schottky barrier potential in a case where Pt is in schottky contact with the GaAs substrate is higher than in case of Al or Ti. Therefore, an allowable range of a forward voltage applied to the gate electrode 107 of the MESFET can be extended and a large input signal can be input to the MESFET. Thus, when it is used as a power amplifier, a great amount of output power can be obtained. Furthermore, when Pt etc. is embedded by heat treatment, a thickness of a channel layer at both sides of the gate can be greater than that at a part of the channel layer beneath the embedded gate. Thus, parasitic resistance occurred in this area can be restrained and transconductance gm of the Field effect transistor can be improved. In addition, embedded gate structure can improve mechanical adhisiveness to the GaAs substrate.

As shown in FIG. 6, the above MESFET has a gate metal 107 further extended except for the regions being in contact with the semiconductor, and has an advantage of reducing the gate metal resistance. However, when Pt and Pd are used for gate electrode material, Pt and Pd do not adhere fixedly to the insulating film 105 containing SiO$_2$ layer. As a result, the gate metal on the insulating film 105 is stripped and torn off soon after the gate electrode 107 is formed. This problem can not be solved even when the heat treatment is applied. Thus, the characteristics become degraded due to the increase of gate resistance and the production yield is reduced.

SUMMARY OF THE INVENTION

The present invention has been made to solve the above conventional problem and has an objective to provide the field effect transistor semiconductor which has great adhesiveness between a gate metal and an insulating film defining a gate electrode end and to improve the production yield thereof.

The field effect transistor semiconductor in this invention comprises a source/drain electrode positioned in a predetermined position in a semiconductor substrate, a channel region provided in the semiconductor substrate and between the source/drain electrodes, a gate electrode which is in schottky contact with a part of a channel region and is positioned between the source/drain electrodes, an insulating film which electrically insulates a surface of the semiconductor substrate and the gate electrode at both side surfaces of the gate electrode. And the gate electrode covers a part of the insulating film and the surface of the substrate serving as the channel region, and a bottom metallic layer contained in the gate electrode is covered with a second metallic layer which is highly adhesive to the insulating film.

The bottom metallic layer may contain Pt, Pd, or Ni, and the second metallic layer may contain Ti or Al.

Regarding the above field effect transistor semiconductor, the metallic film of the gate electrode on the insulating film containing an SiO$_2$ film and defining an end of the gate electrode can be prevented from being stripped. Thus, an increase in the gate resistance can be prevented, resulting in high production yield.

The field effect transistor semiconductor in the present invention comprises a source/drain electrode positioned in a predetermined position in a semiconductor substrate, a channel region provided in the semiconductor substrate and between the source/drain electrodes, a gate electrode which is in schottky contact with a part of the channel region and is positioned between the source/drain electrodes, an insulating film which electrically insulates a surface of the semiconductor substrate and the gate electrode at both side surfaces of the gate electrode. And the gate electrode covers a part of the insulating film and the surface of the substrate serving as the channel region, and a thin film which is highly adhesive to the gate electrode is positioned between the insulating film and the gate electrode.

The thin film is a metallic film of tungsten (W), titan (Ti), molybdenum (Mo), or tungsten nitride (WN), or an alloy containing them.

Regarding the above structure, a thin film which is highly adhesive is inserted between the gate electrode containing Pt, Pd etc. and the insulating film. Thus the gate electrode can be prevented from being stripped.

The thin film can be silicon (Si) or an insulating film containing a large amount of silicon.

When Si or an insulating film containing a large amount of Si is inserted between the gate electrode and the insulating film, Pt, Pd etc. at the bottom layer of the gate electrode and Si react chemically to generate silicide by heat treatment. As a result, the adhesiveness improves further.

A method for manufacturing the field effect transistor in the present invention comprises a process for forming a first insulating film on a semiconductor substrate on which an operating layer is formed, a process for forming a photoresist pattern on the first insulating film, a process for forming a high density active layer by making the photoresist pattern as a mask, a process for forming a second insulating film on the first insulating film by making the photoresist pattern as a mask, a process for removing the photoresist and the second insulating film adhering thereon by a lift-off method, a process for forming a source/drain electrode in a region including at least a part of the high density active layer, a process for forming a photoresist pattern of overhang shape by photoresist coating, light exposure, and development, together with exposing a surface of the semiconductor substrate by removing the first insulating film by etching where the photoresist serves as a mask, further forming a bottom metallic layer being in schottky contact with the semiconductor by a vapor deposition method which is superior in deposition in vertical direction, a process for forming a metallic film which is highly adhesive to the insulating film which defines a gate electrode end by vapor deposition from a slanting direction so as to cover the metallic film, and a process for forming a gate electrode by a lift-off method where photoresist pattern is solved.

A method for manufacturing the field effect transistor in this invention comprises a process for forming a first insulating film on a semiconductor substrate on which an operating layer is formed, a process for forming a photoresist pattern on the first insulating film, a process for forming a high density active layer by making the photoresist pattern as a mask, a process for forming a second insulating film on the first insulating film by making the photoresist pattern as a mask and forming a thin film which is highly adhesive to a gate electrode on the second insulating film, a process for removing the photoresist, the second insulating film adhering thereon, and the thin film by a lift-off method, a process for forming a source/drain electrode in a region including at least a part of the high density active layer, a process for exposing a surface of the semiconductor substrate by removing the first insulating film by etching where the thin film serves as a mask, and forming a gate electrode which covers a part of the peripheral thin film including the exposed area, and a process for removing the thin film by making the gate electrode as a mask.

The foregoing and other objects, features, aspects and advantages of the present invention will become more apparent from the following detailed description of the present invention when collected conjunction with the accompanying drawings.

DESCRIPTION OF PREFERRED
EMBODIMENTS OF THE INVENTION

Explanation will be made on embodiments of the present invention with reference to the drawings.

Figure 1:
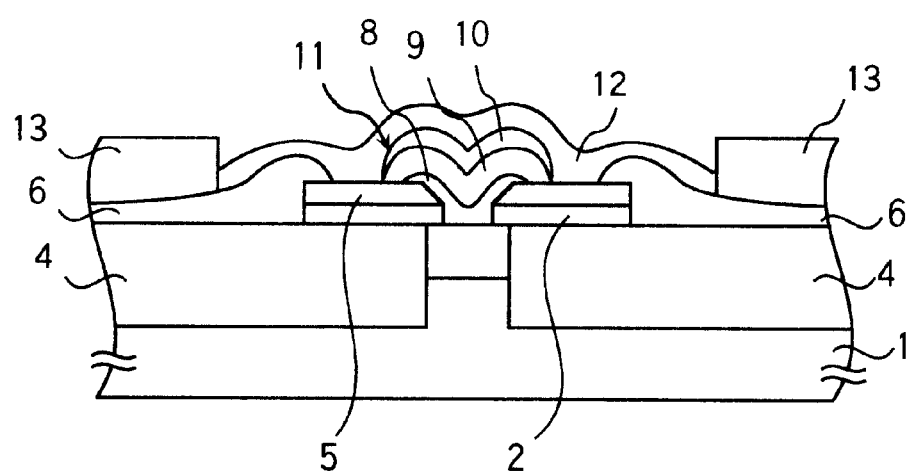
FIG. 1 is a cross-sectional view illustrating a field effect transistor semiconductor according to a first embodiment of the present invention.

FIG. 1 is a cross-sectional view illustrating a field effect transistor semiconductor according to a first embodiment of the present invention.

The first embodiment uses a GaAs epitaxial semiconductor substrate as one of typical compound semiconductors, and applies it for the field effect transistor manufactured by a self-alignment process employing a dummy gate pattern.

A high density active layer 4 containing an $n^+$layer is formed by ion-implantation of n-type impurity such as Si (silicon) on a GaAs epitaxial semiconductor substrate 1 having a channel layer. An insulating film 5 containing an SiN film 2 and $SiO_2$ film is formed on regions in the substrate 1 except for a gate electrode forming region and an ohmic contact region in the high density active layer 4. The gate electrode forming region is self-aligned to form with respect to the high density active layer 4 through the following processes, reducing parasitic resistance of the field effect transistor.

A source/drain electrode 6 containing a laminated metallic film of AuGe/Ni/Au is formed on the ohmic contact region of the high density active layer 4 containing an $n^+$layer, and is in ohmic-contact with the high density active layer 4. After forming the laminated metallic film, alloying process including heat treatment for five seconds at 400° C. is carried out.

On the gate electrode forming region, Pt, Pd, or Ni as a bottom layer metal which is in schottky-contact with the GaAs semiconductor is formed as a gate electrode by a vapor deposition method which is superior in deposition in vertical direction. In this embodiment, a Pt metallic film 8 is formed as the bottom layer metal of the gate electrode by a vapor deposition method which is superior in deposition in vertical direction. Then, a Ti or Al metallic film, a Ti metallic film 9 in this embodiment, which is highly adhesive to the insulating film 5 defining a gate electrode end, is formed by a vapor deposition method carried out from a slanting direction so as to cover the metallic film, further, a Pd/Au film 10 is formed in sequence to obtain the gate electrode 11.

The gate electrode 11 would not be stripped in this case since the metallic film 8 at the bottom layer of the gate electrode 11 is covered with the Ti metallic film 9 which is highly adhesive to the insulating film 5.

A protection film 12 is formed thereon, and an electrode 13, which is in contact with an external bias line via a contact hole, is formed.

Explanation on a method for manufacturing the field effect transistor semiconductor in the present invention will be made by reference to FIGS. 2A to 2H. FIGS. 2A to 2H are cross-sectional views illustrating the field effect transistor semiconductor in each production process according to the first embodiment of the present invention.

The first embodiment uses a GaAs epitaxial semiconductor substrate, one of typical compound semiconductors and applies it for the field effect transistor manufactured by a self-alignment process employing a dummy gate pattern.

First of all, an SiN protection film 2 of approximately 50 nm in thick is formed on a GaAs epitaxial semiconductor substrate 1 having a channel layer by an ECR plasma CVD method. The channel region can be selectively formed by ion-implantation. On the SiN protection film 2, a dummy gate 3 containing photoresist is formed by such processes as photoresist coating, such as PMMA, light exposure, and development. And a high density active layer 4 containing an n+layer is formed by ion-implantation of n-type impurity such as Si (silicon) (see FIG. 2A).

Figure 2A:
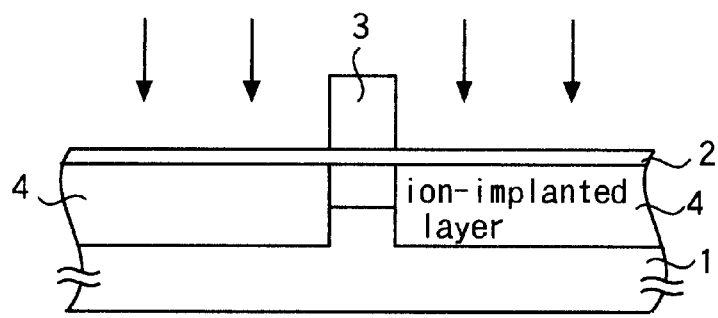
FIGS. 2A to 2H are cross-sectional views illustrating the field effect transistor semiconductor in each production process according to the first embodiment of the present invention.
Figure 2B:
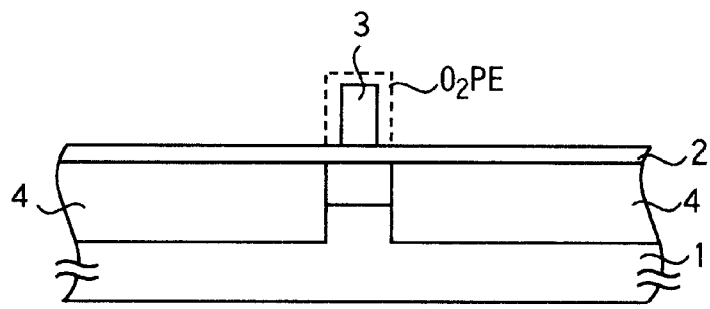

Then, the width of the dummy gate 3 is reduced by oxygen plasma to shorten the length of the dummy gate (see FIG. 2B).

Figure 2C:
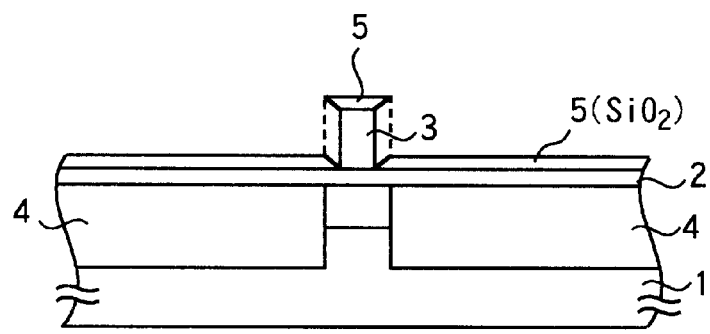
Figure 2D:
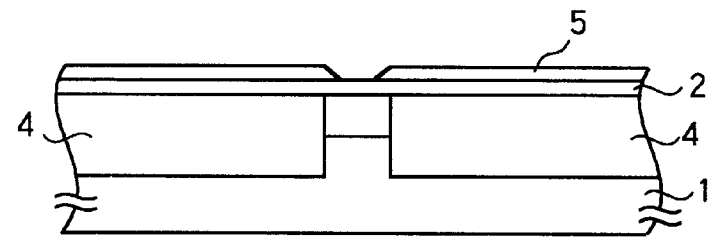
Figure 2E:
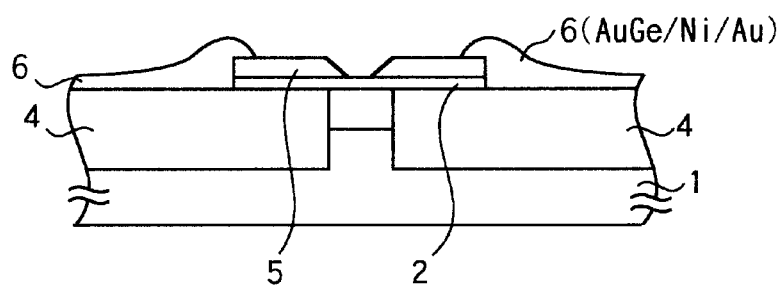
Figure 2F:
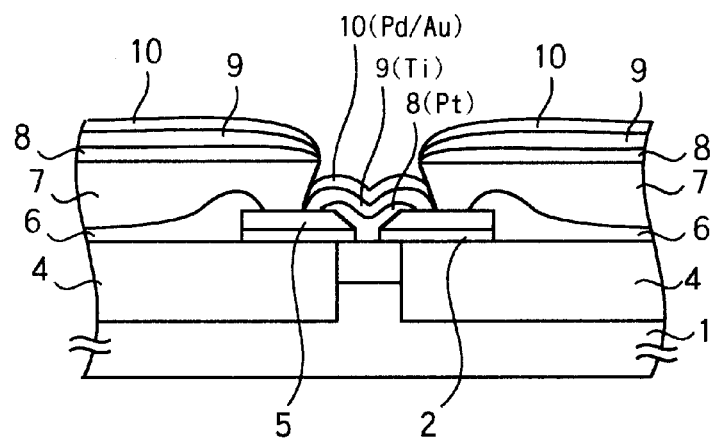

Next, an insulating film 5 containing an $SiO_2$ film is deposited on the substrate 1 by an ECR plasma CVD method, and the $SiO_2$ film adhering to the side walls of the dummy gate 3 is selectively etched by buffer HF ($HF:NH_4F=1:100$) (see FIG. 2C).

The gate pattern is formed by a lift-off method, and it is annealed for a rapid thermal process in order to electrically activate the ion-implanted region. The annealing is, for example, carried out for five seconds at 850° C. (see FIG. 2D). By the above processes, the gate electrode forming region is self-aligned to form with respect to the high-density active layer 4, reducing parasitic resistance of the field effect transistor.

Then, the insulating film 5 and the SiN film 2 on the high-density active layer 4 containing an n+layer are removed. A source/drain electrode 6 containing a laminated metallic film of AuGe/Ni/Au is formed by patterning technique to be in ohmic-contact with the high density active layer 4. After forming those laminated metallic film, alloying process including heat treatment for five seconds at 400° C. is carried out(see FIG. 2E).

Further, photoresist coating, light exposure, and development are carried out to form a photoresist pattern of overhang shape, and simultaneously the SiN film 2 on the gate electrode region is removed. Pt, Pd, or Ni as a bottom layer metal of a gate electrode which is in schottky contact with the GaAs semiconductor is formed by a vapor deposition method which is superior in deposition in vertical direction.

In this embodiment, a Pt metallic film 8 as the bottom layer of the gate electrode is formed by a vapor deposition method which is superior in deposition in vertical direction. Then, a Ti or Al metallic film, a Ti film 9 in this embodiment, which is highly adhesive to the insulating film 5 defining a gate electrode end, is formed, and a Pd/Au film 10 is formed in sequence (see FIG. 2F). The above described resist pattern of overhang shape may be formed by selecting conditions of resist and developing solution or by such methods as applying a two-layer resist structure.

Figure 2G:
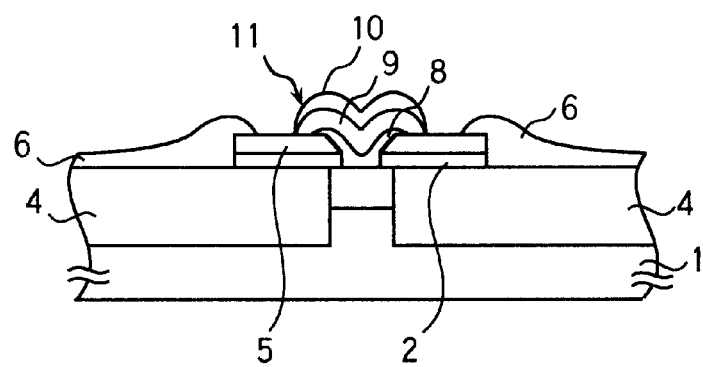
Figure 2H:
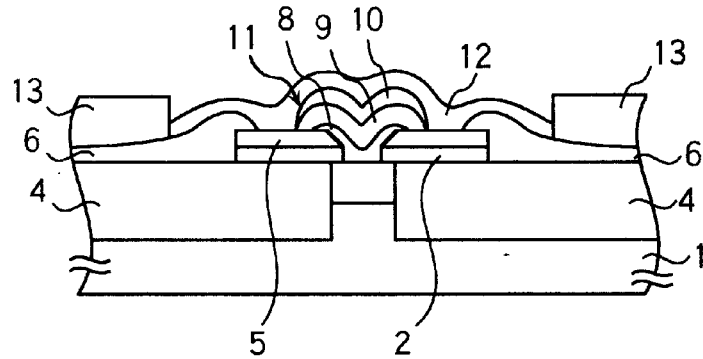

After solving a photoresist pattern, a gate electrode 11 is formed by a lift-off method (see FIG. 2G). The gate electrode 11 would not be stripped in this case since the metallic film 8 as the bottom layer of the gate electrode 11 is covered with the Ti metallic film 9 which is highly adhesive to the insulating film 5.

Finally, a protection film 12 and a contact hole are formed. Then, an electrode 13, which is in contact with an external bias line, is formed by patterning technique (see FIG. 2H).

Regarding the field effect transistor manufactured through processes of the present invention, the metallic film of the gate electrode 11 on the insulating film 5 containing an $SiO_2$ film defining a gate electrode end can be prevented from being stripped. Thus, an increase in the gate resistance can be prevented, resulting in high production yield.

Figure 3:
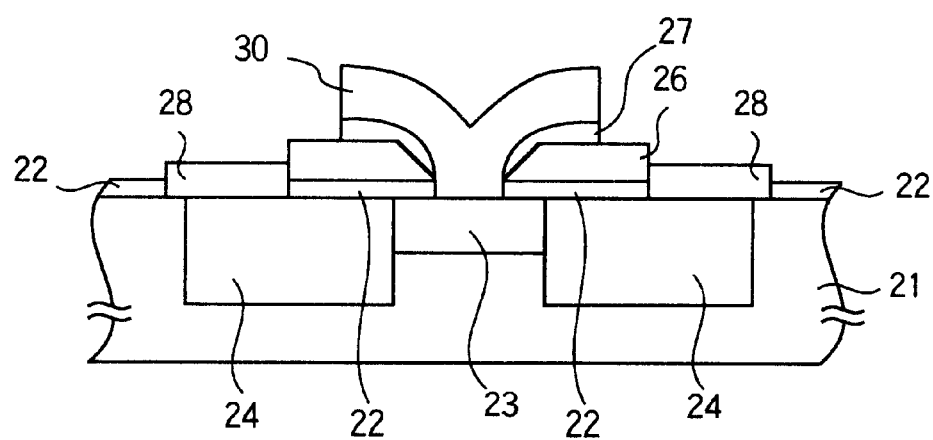
FIG. 3 is a cross-sectional view illustrating the field effect transistor semiconductor according to a second embodiment of the present invention.

FIG. 3 is a cross-sectional view illustrating the field effect transistor semiconductor according to a second embodiment of the present invention.

The second embodiment uses a semi-insulator GaAs substrate as one of typical compound semiconductors, and applies it for the field effect transistor manufactured by a self-alignment process employing a dummy gate pattern.

First of all, a channel region 23 is formed in a semi-insulator GaAs substrate 21 by making photoresist as a mask. And, a high density active region 24 is formed in the substrate 21 by ion-implantation using a dummy gate. An insulating film 26 containing an $SiO_2$ film is formed in a region in the substrate 21 except for a gate electrode forming region and an ohmic contact region in the high density active layer 24. The gate electrode forming region is self-aligned to form with respect to the high density active layer 24 through the following processes, reducing parasitic resistance of the field effect transistor. In this invention, a thin film 27 which is highly adhesive to a gate electrode is formed on the insulating film 26. As the thin film, Ti, W, Mo, WN, or Si alone or a thin alloy film composed by them which is formed by deposition or an ECR plasma CVD method, or a silicon oxide film or silicon nitride film containing a large amount of silicon which is formed by an ECR plasma CVD method is used.

An ohmic metallic thin film for a source/drain electrode containing AuGe/ Ni is formed in an ohmic contact region of the high density active layer 24, and a source/drain electrode 28 is formed by alloying process including heat treatment for five seconds at 400° C.

A gate electrode 30 is deposited on the gate electrode forming region. The gate electrode 30 has Pt, Pd, or Ni of 0.02 μm in thick which is in schottky contact with the channel layer at its bottom and a laminated film of Ti(0.01 μm)/Au(0.5 μm) thereon for purposes of reduction in gate metal resistance.

Explanation on a method for manufacturing the field effect transistor semiconductor in the present invention will be made by reference to FIGS. 4A to 4I. FIGS. 4A to 4I are cross-sectional views illustrating the field effect transistor semiconductor in each production process according to the second embodiment of the present invention.

The second embodiment uses a semi-insulator GaAs substrate, one of typical compound semiconductors and applies it for a field effect transistor manufactured by a self-alignment process employing a dummy gate pattern.

Figure 4A:
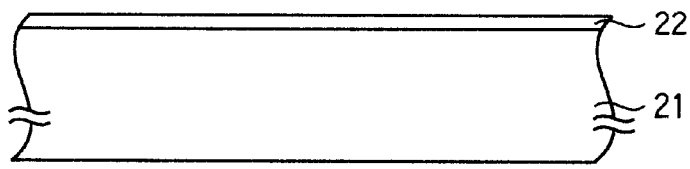
FIGS. 4A to 4I are cross-sectional views illustrating the field effect transistor semiconductor in each production process according to the second embodiment of the present invention.

First of all, an SiN film 22 of 0.02 μm in thick is formed on a semi-insulator GaAs substrate 21 by a CVD method (see FIG. 4A).

Figure 4B:
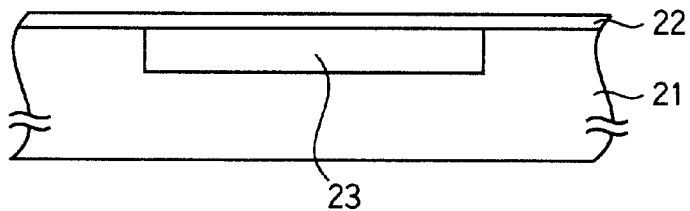

A channel region 23 is formed in the GaAs substrate 21 by making photoresist as a mask (see FIG. 4B). Although FIGS. 4 illustrates that the channel region 23 is selectively formed by ion-implantation, wafer in which a channel layer is epitaxially grown on a semi-insulator GaAs substrate may also be used.

Figure 4C:
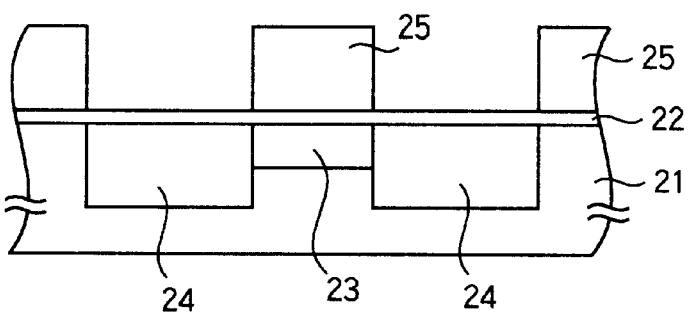
Figure 4D:
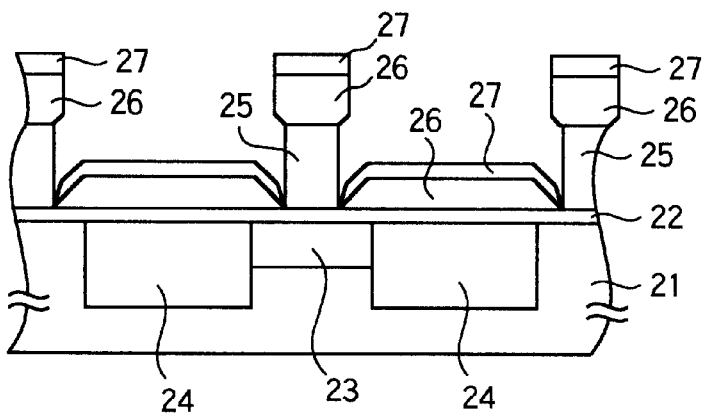

A high density active region 24 is formed by ion-implantation using a dummy gate 25 containing photoresist patterned to be 1 μm in thick and 2 μm in length as a mask (see FIG. 4C). After reducing the length of the dummy gate by 0.5 μm at each side of the dummy gate 25 by oxygen plasma etching to shorten the width of the dummy gate, an insulating film 26 containing an SiO$_2$ film of 0.3 μm in thick is formed by an ECR plasma CVD method. Further, in this invention, a thin film 27 which is highly adhesive to a gate electrode is formed on the insulating film 26. As the thin film, Ti, W, Mo, WN, Si alone or a thin alloy film composed by them is formed by deposition or an ECR plasma CVD method, or a silicon oxide or silicon nitride film containing a large amount of silicon is formed by an ECR plasma CVD method(see FIG. 4D). By these processes, a gate electrode forming region is self-aligned to form with respect to the high-density active layer 24, reducing parasitic resistance of the field effect transistor.

Figure 4E:
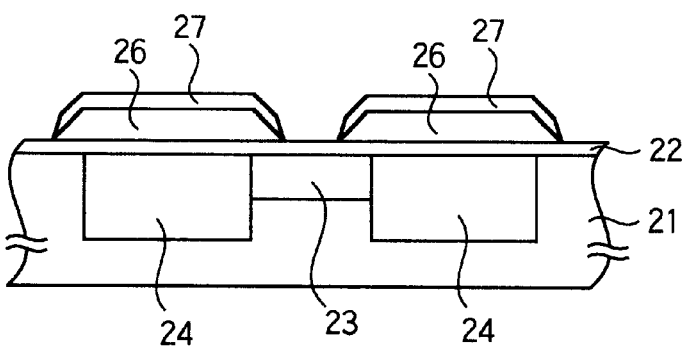

Then, photoresist (the dummy gate 25), the SiO$_2$ film 26 thereon, and the metallic thin film 27 are removed by a lift-off method, and annealing is carried out for five seconds at 850° C. in order to electrically activate the ion-implanted region (see FIG. 4E).

Figure 4F:
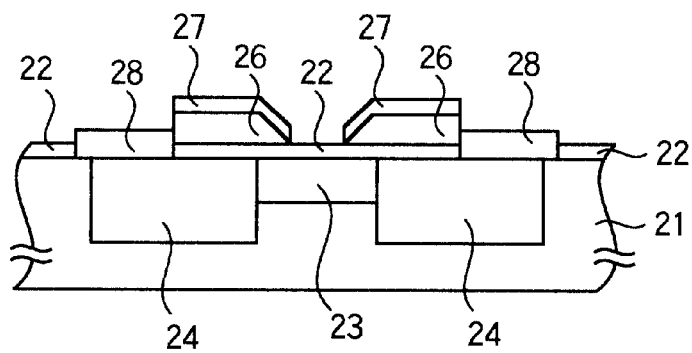

An ohmic metallic thin film for a source/drain electrode containing AuGe/Ni is formed and alloying process including heat treatment for 5 seconds at 400° C. is carried out to form a source/drain electrode 28 (see FIG. 4F).

Figure 4G:
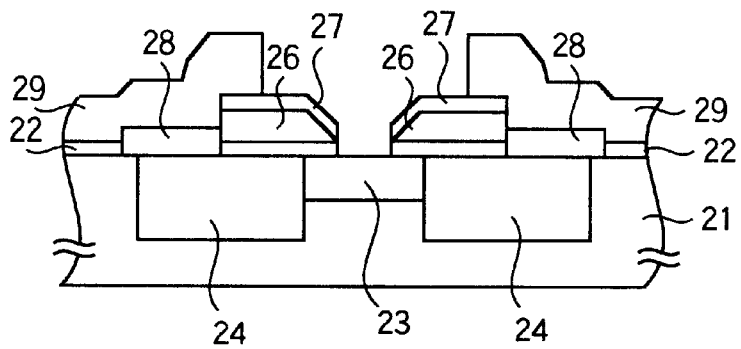

Then, by making photoresist 29 and the metallic thin film 27 as a mask, the SiN film 22 in the gate electrode forming region is removed by plasma etching (see FIG. 4G).

Figure 4H:
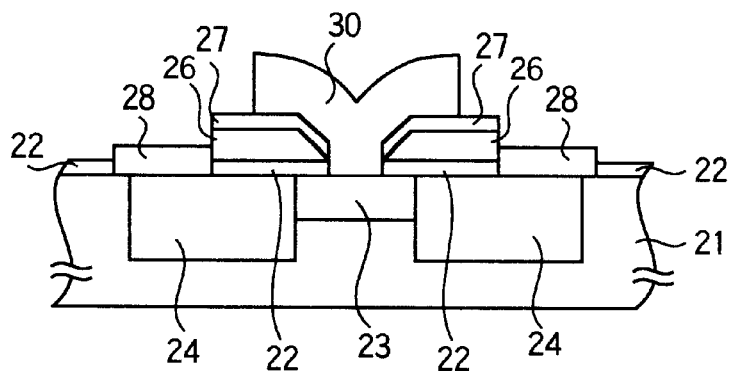

A gate electrode 30 is deposited and the photoresist and the metal thereon are removed by a lift-off method (see FIG. 4H). The gate electrode 30 has Pt, Pd, or Ni of 0.02 μm in thick which is in schottky contact with the channel layer at its bottom, and a laminated film of Ti (0.01 μm)/Au (0.5 μm) formed thereon for purposes of reduction in the gate metal resistance.

Figure 4I:
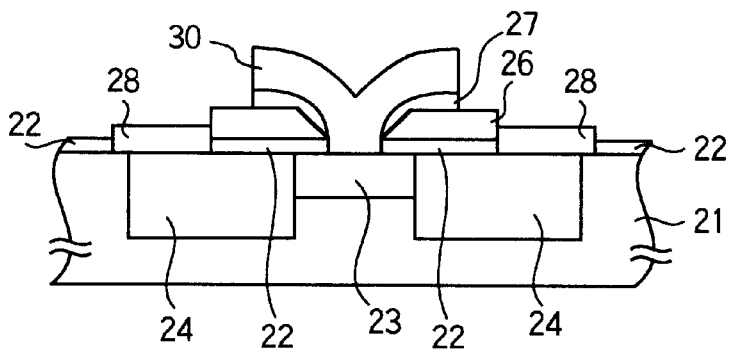
Figure 5A:
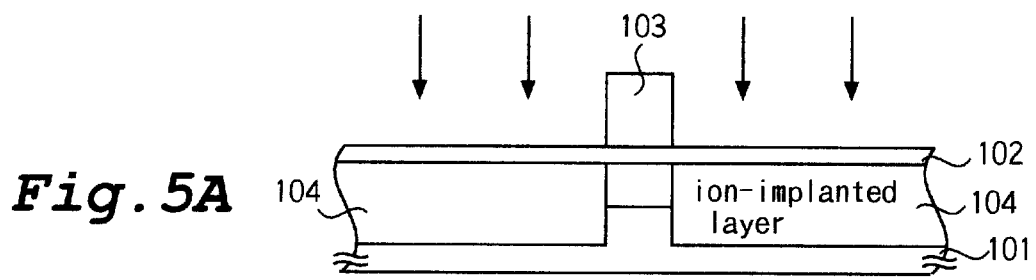
FIGS. 5A to 5F are cross-sectional views illustrating a conventional field effect transistor semiconductor in each production process.
Figure 5B:
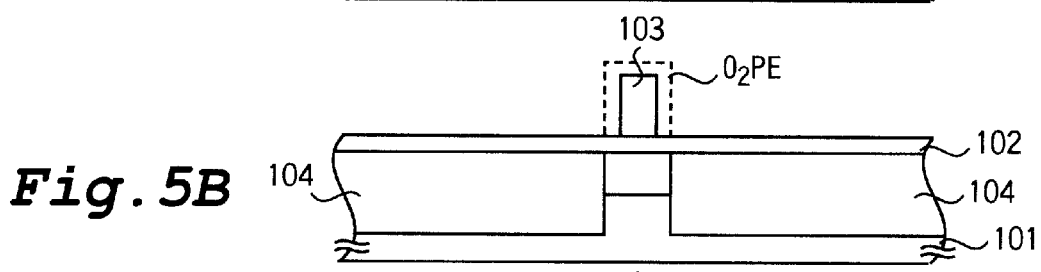
Figure 5C:
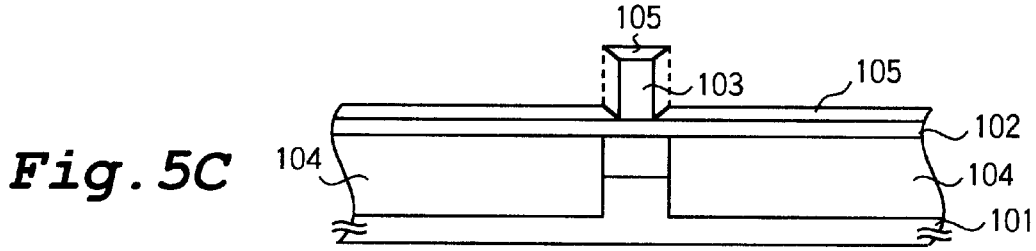
Figure 5D:
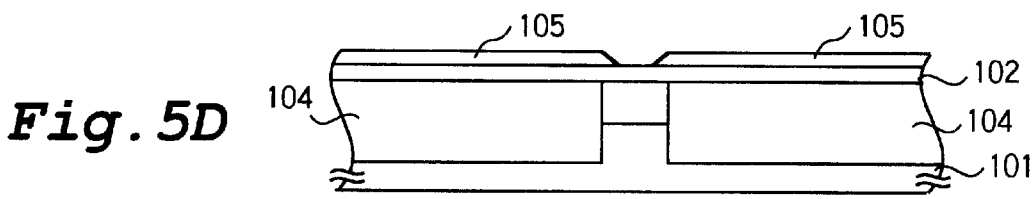
Figure 5E:
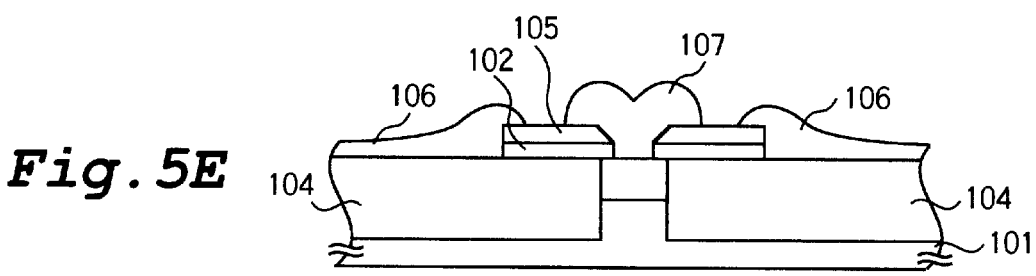
Figure 5F:
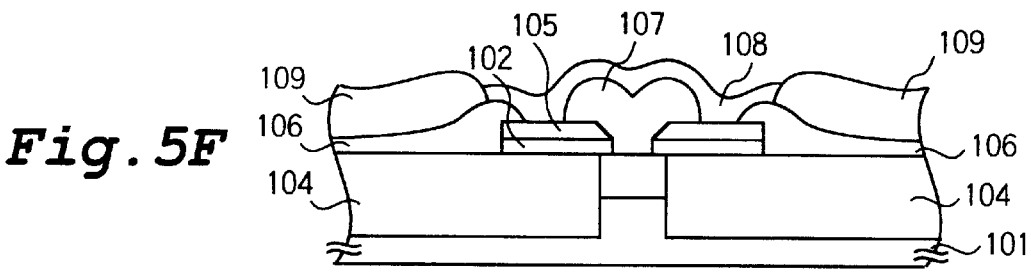
Figure 6:
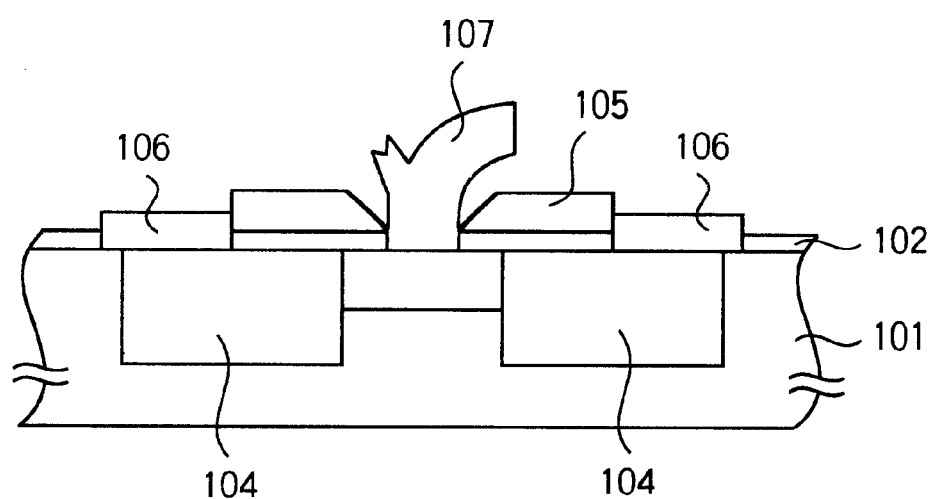
FIG. 6 is a cross-sectional view illustrating a problem in the conventional field effect transistor semiconductor.

The gate electrode 30 is made as a mask and the metallic thin film 27 is removed by etching (see FIG. 4I). Then, a protection film and a contact hole are formed, further an electrode, which is in contact with an external bias line, is formed by patterning technique to obtain the field effect transistor of the present invention.

In the above embodiment, heat treatment is not applied after the gate electrode is formed. However, the gate electrode can be prevented from being stripped since a thin film, which is highly adhesive, is inserted between the gate electrode containing Pt or Pd and the insulating film. When heat treatment is carried out for embedding Pt etc. after the above process, the same effect as that in the above description can be obtained.

When Si or an insulating film containing a large amount of Si is inserted between the gate electrode and the insulating film, Pt, Pd etc. at the bottom layer of the gate electrode and Si react chemically to generate silicide by heat treatment. As a result, the adhesiveness improves further.

As explained above, the field effect transistor structure of the present invention can improve adhesiveness between the insulating film, which defines the gate electrode end, and the gate metal, thus improves production yield of the field effect transistor.

Although the present invention has been described and illustrated in detail, it is clearly understood that the same is and example only and is not to be taken by way of limitation by way of illustration, the spirit and scope of the present invention being limited only by the terms of the appended claims.

What is claimed is:

1. A field effect transistor semiconductor comprising:
   a source/drain electrode positioned in a predetermined position in a semiconductor substrate;
   a channel region provided in the semiconductor substrate and between the source/drain electrodes;
   a gate electrode which is in Schottky contact with a part of a channel region and is positioned between the source/drain electrodes; and
   an insulating film which electrically insulates a surface of said semiconductor and the gate electrode at both side surfaces of said gate electrode,
   wherein said gate electrode covers a part of said insulating film and the surface of the substrate serving as said channel region, and a bottom metallic layer contained in said gate electrode is covered with a second metallic layer formed by a vapor deposition method carried out from a slanting direction wherein the second metallic layer is highly adhesive to said insulating film.

2. The field effect transistor semiconductor according to claim 1, wherein said semiconductor substrate is a GaAs epitaxial substrate or a semi-insulator GaAs substrate having an operating layer thereon.

3. The field effect transistor semiconductor according to claim 1, wherein said bottom metallic layer contains Pt, Pd, or Ni, and said second metallic layer contains Ti or Al.

4. A field effect transistor semiconductor comprising:
   a source/drain electrode positioned in a predetermined position in a semiconductor substrate;
   a channel region provided in the semiconductor substrate and between the source/drain electrodes;
   a gate electrode which is in Schottky contact with a part of the channel region and is positioned between the source/drain electrodes; and
   an insulating film which electrically insulates a surface of said semiconductor substrate and the gate electrode at both side surfaces of said gate electrode, wherein
   said gate electrode covers a part of said insulating film and the surface of the substrate serving as said channel region and a thin film which is positioned between said insulating film and the gate electrode, the thin film being formed successively after forming said insulating film, wherein the thin film is highly adhesive to the gate electrode.

5. The field effect transistor semiconductor according to claim 4, wherein said semiconductor substrate is a GaAs epitaxial substrate or a semi-insulator GaAs substrate having an operating layer thereon.

6. The field effect transistor semiconductor according to claim 4, wherein said thin film is silicon or an insulating film containing a large amount of silicon.

7. The field effect transistor semiconductor according to claim 4, wherein said thin film is a metallic film of tungsten, titanium, molybdenum, or tungsten nitride, or an alloy containing them.

8. The field effect transistor semiconductor according to claim 4, wherein said gate electrode contains Pt, Pd, or Ni.

9. The field effect transistor semiconductor according to claims 1 or 4, wherein said semiconductor substrate is a GaAs epitaxial substrate or a semi-insulator GaAs substrate having an operating layer thereon.

* * * * *